United States Patent [19]

Kumar et al.

[11] Patent Number: 5,789,979
[45] Date of Patent: Aug. 4, 1998

[54] REDUCTION OF EXCESSIVE SPECTRAL POWER DISTRIBUTION FROM CLASS-C SATURATED AMPLIFICATION OF A PULSED-CARRIER SIGNAL

[75] Inventors: Mahesh Kumar, Hauppauge; Michael Hanczor, Commack; Allan S. Moskowitz, Brooklyn, all of N.Y.

[73] Assignee: Lockheed Martin Corporation, Bethesda, Md.

[21] Appl. No.: 819,308

[22] Filed: Mar. 18, 1997

[51] Int. Cl.$^6$ ........................................................ H03F 1/32
[52] U.S. Cl. ........................... 330/149; 375/297; 455/114
[58] Field of Search ............................... 330/124 R, 149, 330/295; 332/107, 123, 159; 375/297; 445/114; 342/193, 204

[56] References Cited

U.S. PATENT DOCUMENTS

| | | | |
|---|---|---|---|
| 4,706,262 | 11/1987 | Ohta | 375/297 |
| 4,928,072 | 5/1990 | Scott | 330/149 |
| 5,381,110 | 1/1995 | O'Leary et al. | 330/149 |

Primary Examiner—James B. Mullins
Attorney, Agent, or Firm—Perman & Green, LLP

[57] ABSTRACT

In an amplifier for amplifying a pulsed sinusoidal carrier signal, wherein the amplifier employs an amplifier element operative as Class-C with a saturation operation region which increases the sharpness of leading and trailing edges of a rectangular pulse envelope of the pulsed carrier signal for undesirable spectral spreading of energy of the signal, a method of reducing the spectral spreading of the energy employs a modification of the rectangular envelope of the pulsed carrier signal to a trapezoidal envelope. The leading and the trailing edges of the trapezoidal envelope constitute envelopes of sinusoidal waveforms of increasing and decreasing amplitude, respectively. The peak amplitudes of the largest amplitude sinusoidal of the leading and the trailing edges have powers which exceed a power level inducing the saturated operation of the amplifier element such that there is a decrement in incremental power gain by a factor of approximately 3 dB. In the pulse of carrier signal outputted by the amplifier element, the carrier in a central region thereof has a substantially square-wave configuration while, at the leading and the trailing edges, the cycles of the waveform are substantially sinusoidal. A bank of numerous amplifying channels, each of which contains the amplifier element, are fed the modified envelope by a common filter which produces the modification.

23 Claims, 6 Drawing Sheets

REDUCTION OF EXCESSIVE SPECTRAL POWER DISTRIBUTION FROM CLASS-C SATURATED AMPLIFICATION OF A PULSED-CARRIER SIGNAL

BACKGROUND OF THE INVENTION

This invention relates to amplification of a pulse-modulated sinusoidal signal by a Class-C high power amplifier operating in a saturated mode and, more particularly, to the modification of a rectangular amplitude envelope of an input signal to a trapezoidal envelope, wherein in each of the ramps at leading and trailing edges of the trapezoidal envelope, there is a range of amplitude of sinusoidal signal extending from the amplitude level below a saturation level of the amplifier to an amplitude level above the saturation level of the amplifier.

Pulsed carrier signals are employed in numerous electronic systems, including communication and radar systems, by way of example. In both radar and communication systems, it is necessary to transmit a pulse of relatively high power at a radio-frequency (RF) spectral band from one location to another. To improve efficiency of power amplifiers which provide output signals at high power levels, it is a common practice to construct the amplifiers of solid state components, such as power transistors, which are operated both in a saturating mode, and in Class-C amplification. Many of the newer transistors employed for the Class-C amplification have very fast turn-on and turn-off times which are much smaller than a cycle of the RF carrier. The turn-on time is the time required to initiate conduction of a transistor, and the turn-off time is the time required to terminate conduction of the transistor. The rapid turn-on and turn-off times produce very sharp leading and trailing edges to a pulse signal having a rectangular amplitude envelope. The rapid rise and fall times of the envelope produce a significant amount of energy in spectral components beyond that which is required for preserving information carried by the signal pulse. For example, the pulse may be modulated by frequency modulation or phase modulation of the carrier, this being in addition to the amplitude modulation of the carrier. The modulation carries information such as timing data, or a predetermined signal pattern suitable for correlation with a reference pattern at a receiver or signal processor.

A problem arises, particularly in situations wherein a plurality of electronic devices, such as transmission and receiving antennas, are mounted close together, as in the case of a vehicle, such as an aircraft or a ship, carrying such electronic devices. Such devices are operative with signals having predesignated spectra wherein, typically, the amplitudes of frequency components in the skirts of the spectra are specified so as to prevent contamination of the signal of one of the devices with low-amplitude spectral components of the signal of a neighboring device. In the case of signals amplified by Class-C saturating amplifiers, this problem has been solved in the past by placing a band-pass filter at the output terminal of the amplifier. Such a filter has the desired effect of reducing the spectral energy component outside of the portion of the spectrum needed for transmission of the signal modulation. Thereby, the filter preserves the form of the signal while protecting the other devices from interference by the signal.

However, it is recognized that with certain electronic devices, particularly a radar transmitter, the output signal has high power and, accordingly, the band-pass filter must be constructed in a form suitable for processing a high-powered signal. To meet this requirement, such a band-pass filter has a large physical size, frequently, as large as a cabinet containing electronic circuit chassis. Such a construction is unduly bulky and heavy, such as to interfere with the mounting and placement of the electronic devices on the vehicle. This is particularly true in the case of a spacecraft wherein available space and weight are severely limited.

SUMMARY OF THE INVENTION

The aforementioned problem is overcome and other advantages are provided by a system and method for reduction of excessive spectral power distribution resulting from the amplification of a pulsed carrier signal by an amplifier operating as Class-C and in a saturated mode. The system of the invention is particularly advantageous for construction of a transmitter of a wind profile radar used in the measurement of wind shear. Typically, such an amplifier is constructed of semiconductor devices, particularly transistors, which, in Class-C operation, require a significant signal level for inducing conduction of current within the transistor, the so-called "turn-on" level. Larger input signal levels experience a linear or quasi-linear amplification by the transistor. For still larger input signals levels, a saturation region is reached. Transistors employed in amplifiers of RF signals provide sharp leading and trailing edges wherein the duration of a leading or trailing edge, as noted hereinabove, is substantially less than the duration of a cycle of the input sinusoidal signal being amplified.

To reduce the excessive, and unnecessary, spectral components resulting from the rapid rise and fall times of the rectangular envelope, the invention provides for a modification of the pulsed sinusoidal signal which is inputted to the amplifier. The modification of the input signal is attained by modifying the rectangular envelope to a trapezoidal envelope providing for leading and trailing edges of the envelope which extend, instead of merely a fraction of a cycle of the sinusoidal signal, over many cycles of the sinusoidal signal. In accordance with the invention, some of the carrier cycles of the leading edge, and also of the trailing edge, are of relatively low amplitude, being somewhat larger than the turn-on threshold, but substantially less than the level at which the saturation region begins. Such carrier cycles of the leading edge, as well as of the trailing edge, to the extent that they exceed the turn-on threshold, are amplified by the amplifier in substantially linear fashion. The carrier cycles in the central portion of the input signal have amplitudes which drive the amplifier into the saturation region. As a result, the output pulse signal has a central portion wherein the cycles of the carrier sinusoidal waveform are limited in amplitude by the saturation of the amplifier, this resulting in an output carrier waveform having the shape substantially of a square waveform. However, at the leading region of the output pulse, immediately preceding the central region, and at a trailing region immediately succeeding the central region, there are cycles of sinusoidal waveform of varying amplitudes which are less than the amplitude of the saturated central region of the output signal. Such a configuration of envelope results in a decreased spectral spread of frequency components of the waveform, as compared to the spectrum of the waveform having the rectangular envelope.

In a preferred embodiment of the invention, the production of the leading and the trailing edges in the form of ramps of the envelope is accomplished by use of a filter having a bandpass characteristic wherein the passband is sufficiently wide to pass modulation of the pulsed carrier signal, while reducing extraneous spectral energy outside of the filter passband. In a typical system configuration for obtaining large power amplification, a multiplicity of the amplifiers are arranged in parallel and are activated by a common signal outputted by the filter. Output signals of the multiple amplifiers are combined to produce a relatively high-powered signal without need for further filtering because of the preconditioning of their respective input signals by the filter. The sinusoidal signal may have phase or frequency modulation in addition to the amplitude modulation. The foregoing filtering preserves data communicated via the pulse carrier waveform, in terms of preserving its modulation, while reducing the extraneous spectral energy outside of the filter passband.

An underlying consideration in the practice of the invention is based on the observation that the power levels employed by a radar transmitter are too high to permit normal fabrication of suitable bandpass filters, and if built, would be overly large, complex and costly. The approach of the invention is to precondition the signal before final stages of amplification so that, after amplification, the signal has the desired shape for a proper spectrum. However, use of the Class-C saturated mode of amplifier limits this approach because of distortion in the waveform, particularly the effect of the turn-on level of successive stages of the amplification. As a result, even with a trapezoidal waveform of the envelope having substantially elongated ramps for the leading and trailing edges, the leading and the trailing edges become too steep by the successive stages of the Class-C, saturated mode amplification. Therefore further processing is required at the higher power levels. In order to handle the power, the invention provides for splitting the final stage of amplification into many parallel channels, using a filter for shaping the input envelope of the pulsed carrier signal to the bank of channels, and then summing, in cophasal fashion at the carrier frequency, the signals of the parallel channels to obtain the desired final output power in an envelope that meets the spectrum requirements. Power division is provided after each stage of the Class-C, saturated mode amplification with a power division ratio approximately equal to the amount of power amplification, thereby to maintain each stage of amplification in normal signal operating range to take advantage of the envelope shaping filter.

BRIEF DESCRIPTION OF THE DRAWING

The aforementioned aspects and other features of the invention are explained in the following description, taken in connection with the accompanying drawing figures wherein.

Identically labeled elements appearing in different ones of the figures refer to the same element but may not be referenced in the description for all figures.

DETAILED DESCRIPTION

Figure 1:
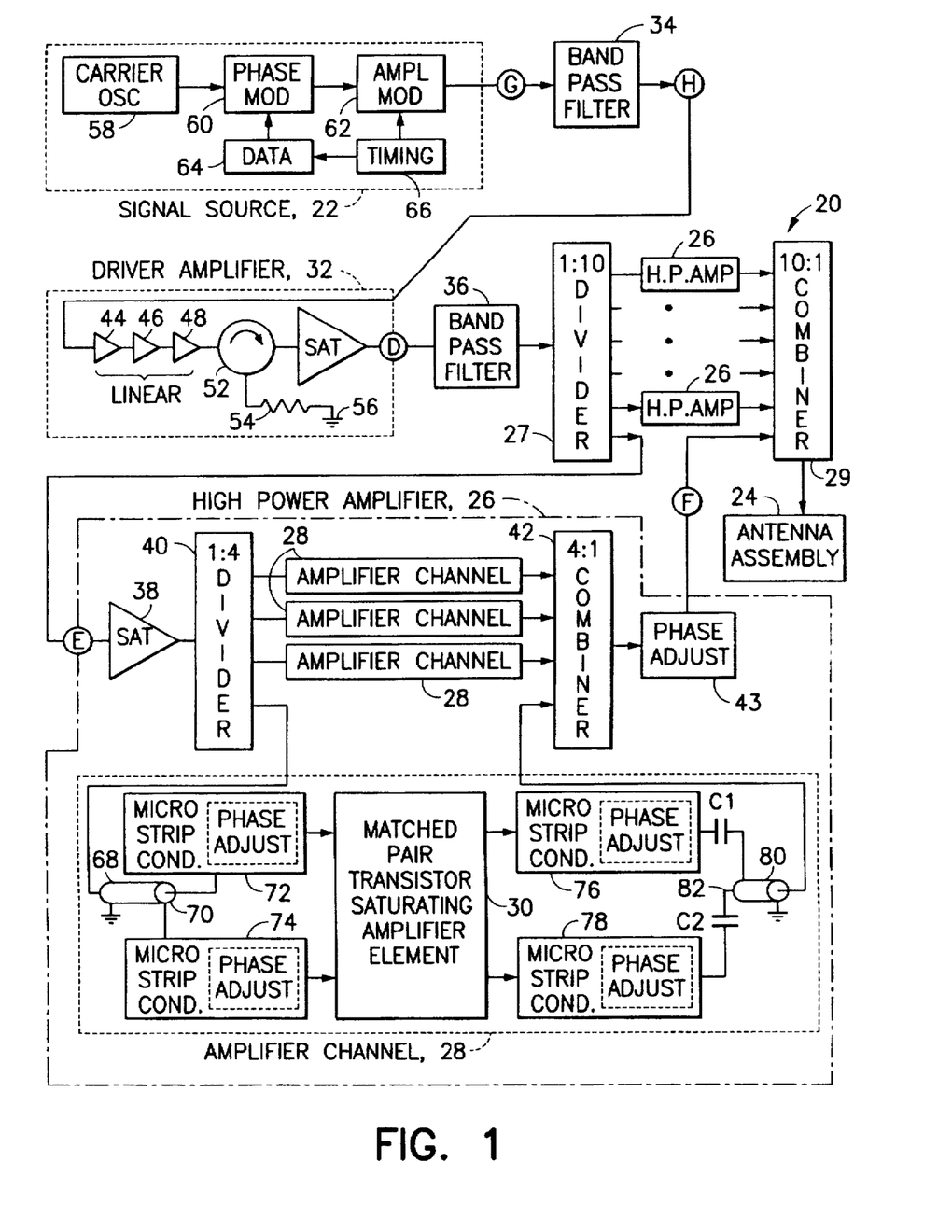
FIG. 1 is a block diagram of a system employing multiple Class-C saturated-mode amplifiers for transmission of a high-powered pulsed carrier signal.

With reference to FIG. 1, there is shown a system 20 for connection of a signal source 22 to an antenna assembly 24 by means of a bank of high-power amplifiers 26. The high-power amplifiers 26 are connected in parallel between a power divider 27 and a power combiner 29, whereby a common signal can be input via the power divider 27 to each of the amplifiers 26 with powers outputted from the bank of amplifiers 26 being applied to the antenna assembly 24 via the combiner 29. By way of example in the use of the invention, an individual one of the amplifiers 26 includes a plurality of amplifier channels 28, each of which includes a Class-C saturating amplifier element 30 in the form of a matched pair of transistors connected for push-pull operation. Signals outputted by the signal source 22 are applied by a driver amplifier 32 to the bank of high-power amplifiers 26. By way of example in the construction of a preferred embodiment of the invention, there are ten of the high-power amplifiers 26, the divider 27 having a division ration of 1:10 and the combiner 29 having a combining ratio of 10:1. Both the divider 27 and the combiner 29 are fabricated of radial low loss construction.

In accordance with the invention, a first band-pass filter 34 is connected between the signal source 22 and the driver amplifier 32. A second band-pass filter 36 connects from the driver amplifier 32 and, via the power combiner 27, to the high-power amplifiers 26.

Each of the high-power amplifiers 26 further comprises an input amplifier stage 38 operating in Class-C and in a saturated mode, a power divider 40, and a power combiner 42. Each of the high-power amplifiers 26 is provided with a phase shifter 43 whereby the relative phases of modulated carrier signals amplified by respective ones of the amplifiers 26 can be adjusted for a cophasal relationship upon an inputting of the signals to the power combiner 29. In each amplifier 26, the phase shifter 43 connects with an output terminal of the combiner 42. A signal inputted to the amplifier 26 via the second filter 36 is amplified by the input stage 38 and applied to the power divider 40. The power divider 40 divides the power of the signal outputted by the amplifier stage 38 equally among the amplifier channels 28, four such channels being shown, by way of example. Each of the amplifier channels 28 is operative to amplify the signal provided by the power divider 40, and to output the amplified signals to the power combiner 42. The power combiner 42 sums together the signals outputted by the respective channels 28 to provide a combined sum signal which is applied, via the combiner 29, to the antenna assembly 24. Each of the amplifier channels 28 includes phase matching circuitry, to be described hereinafter, so that the signals summed by the power combiner 42 are summed in phase to insure maximum power delivery to the antenna assembly 24.

The driver amplifier 32 comprises three serially-connected stages 44, 46, and 48 of linear amplification. The driver amplifier 32 further comprises a saturating amplifier stage 50 which is operative in a saturated mode as a Class-C amplifier and which is connected to an output terminal of the output amplifier stage 48 via a microwave circulator 52. The circulator 52 provides for impedance matching via a resistor 54 connected between a port of the circulator 52 and ground 56. The output terminal of the saturating amplifier stage 50 is connected by the second filter 36 to the input terminal of the input amplifier stage 38 of the high-power amplifier 26.

To facilitate a discussion of signal waveform appearing at various terminals within the circuitry of the system 20, the input terminals of the second filter 36 and the high-power amplifier 26 are identified, respectively, as terminal D and terminal E. The output terminal of the high-power amplifier 26 is identified as terminal F. The input terminal of the first filter 34 is identified as terminal G for connection with the output of the signal source 22. The output terminal of the first filter 34 is connected via terminal H to the input terminal of the amplifier stage 44.

The signal source 22 provides a signal suitable for use in the operation of a radar, by way of example. The source 22 comprises a carrier oscillator 58, a phase modulator 60, and an amplitude modulator 62. Also included in the signal source 22 are a data unit 64 and a timing unit 66. In the operation of the signal source 22, the data unit 64 applies data to the phase modulator 60 which modulates the carrier outputted by the oscillator 58 with phase modulation representing the data. For example, the phase modulation may be phase shift keying or minimum phase keying, the latter constituting an offset frequency for frequency modulation, the frequency modulation being understood to be included, by way of example, within the capabilities of the phase modulator 60. The resulting phase modulated sinusoidal signal outputted by the phase modulator 60 is applied to the amplitude modulator 62. The timing unit 66 provides timing signals which activate the data unit 64 to apply the data, typically in a digital format, to the phase modulator 60, and also operates the amplitude modulator 62 to provide for a pulse modulation of the carrier signal. The signal outputted by the signal source 22, and appearing at terminal G, is thus a pulsed carrier signal.

Each of the amplifier channels 28 is constructed in the same fashion. To simplify the drawing, one of the amplifier channels 28 is shown enlarged with a presentation of various circuit components therein, it being understood that the same circuit components appear in the other ones of the amplifier channels 28. At the input port of each of the amplifier channels 28, there is a coaxial line segment 68 which connects the input signal via a balun 70 to each of two microstrip conductors 72 and 74. Also included within the amplifier channel 28 are two further microstrip conductors 76 and 78 and an output coaxial line segment 80 with a balun 82. The coaxial line segment 80 connects via the balun 82 and a capacitor C1 to the microstrip conductor 76, and via the balun 82 and a capacitor C2 to the microstrip conductor 78. The saturating amplifying element 30 has two input ports and two output ports, the two input ports being connected respectively to the microstrip conductors 72 and 74. The two output ports of the amplifier element 30 are connected respectively to the microstrip conductors 76 and 78.

In the operation of the amplifier channel 28, signals inputted at the input coaxial line segment 68 are split at the balun 70 such that half of the power of the signal is conducted, as a sinusoidal traveling wave, via the microstrip conductor 72 to the amplifier element 30, and the remaining half of the signal power is outputted via the balun 70 to be coupled as a traveling wave via the microstrip conductor 74 to the amplifier element 30. Output signals of the amplifier element 30 are conducted as traveling waves via the microstrip conductors 76 and 78, respectively, and the capacitors C1 and C2, respectively, to be summed together via the balun 82 to be outputted via the output coaxial line segment 80.

As will be described hereinafter in further detail, the leading and the trailing edges of the pulsed carrier signal of the source 22 become more sharply defined by virtue of the saturating and Class-C amplification of the amplifier stages 50 and 38, and the several amplifier elements 30. This effect is noted particularly with respect to the trailing edge of a carrier pulse, and arises because of the very fast turn-off time of transistors of the amplifier stages 50 and 38, and the several amplifier elements 30. Such rapid rise and fall times are not required for a high-fidelity transmission of the modulations within the pulsed carrier signal and, therefore, any additional broadening of the spectrum of the signal resulting from the more sharply defined leading and trailing edges is unnecessary. Furthermore, as has been noted hereinabove, such excessive spectral power distribution may well interfere with other electronic apparatus (not shown in FIG. 1) which may be located in close proximity to the antenna assembly 24. Also, such control of the spectrum may be necessary to meet U.S. governmental requirements set forth in Radar Spectrum Engineering Criteria (RESC), available as an NTIA report from the National Technical Information Service.

The first filter 34 serves to modify the substantially rectangular envelope of a signal pulse outputted by the signal source 22 by converting the rectangular envelope to a trapezoidally shaped envelope. As a result, not all of the cycles of sinusoidal waveform within each of the leading and the trailing edges induce saturation in the operation of the amplifier stage 50. However, a majority of the cycles of the sinusoidal waveform within the leading and the trailing edges have reached into a saturation region at the output of the amplifier stage 50 and, accordingly, the second filter 36 is inserted to reinstate the trapezoidal envelope. The signal outputted by the second filter 36 has a sufficiently long leading edge and sufficiently long trailing edge such that there are numerous cycles of the sinusoidal waveform which do not reach the saturation level, even after amplification of the signal pulse by the amplifier channels 28. Thereby, the signal outputted at terminal F from the high-power amplifier 26 has a spectrum wherein the excessive spectrum power distribution is essentially absent.

Figure 2:
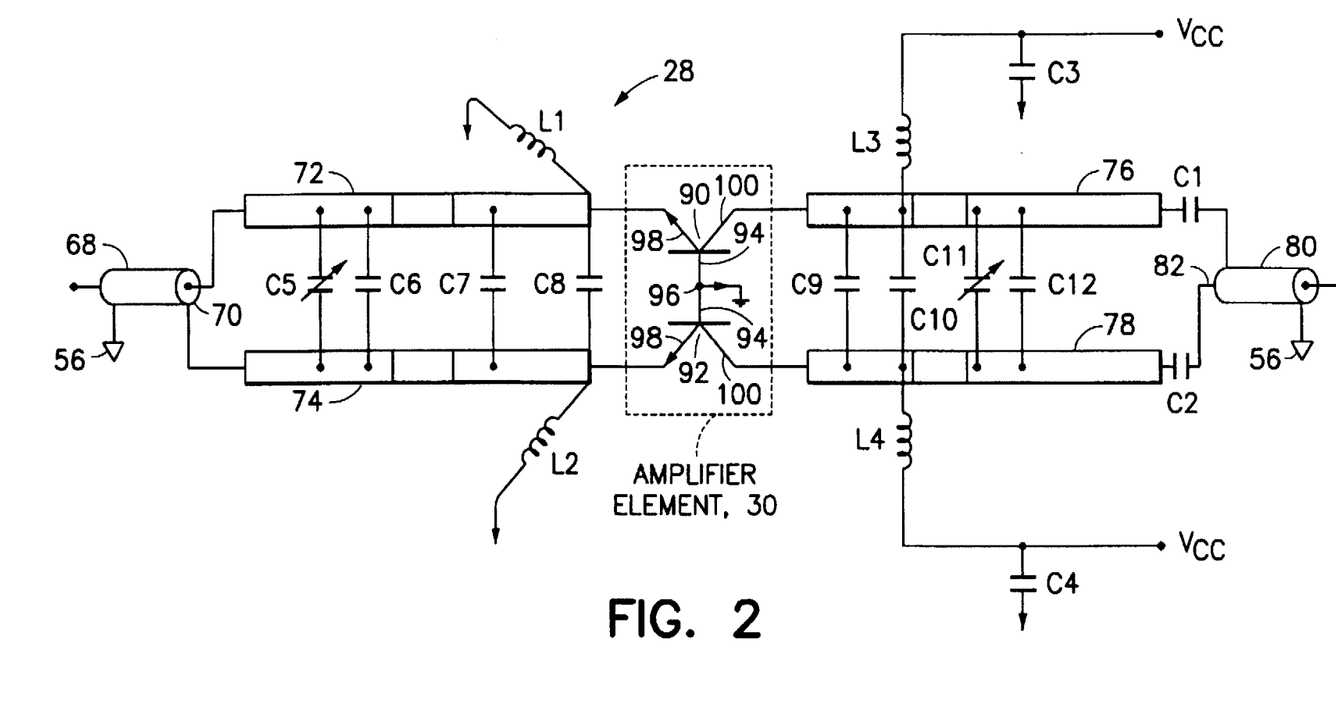
FIG. 2 is a schematic drawing of one of the transistor amplifiers of the system of FIG. 1.
Figure 3:
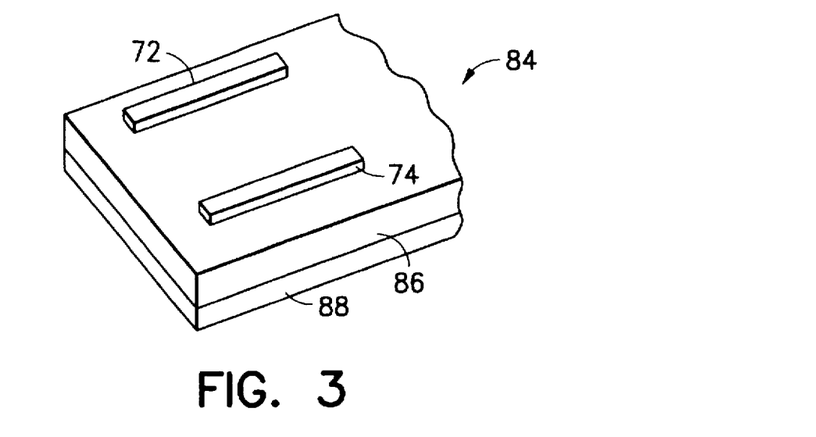
FIG. 3 is a stylized view presenting the physical configuration of the transistor amplifier constructed in microstrip.

FIG. 2 shows further details in construction of the amplifier channel 28 of FIG. 1. Thus, the microstrip conductors 72, 74, 76, and 78 of FIG. 1 are shown also in FIG. 2, as well as the coaxial transition line segments 68 and 80. Also shown is the amplifier element 30 and the capacitor C1 and C2. In a preferred embodiment of the invention which is suitable for the frequency range of 400–500 megahertz (MHz), the components of the electric circuitry of the amplifier channel 28 are built as a microstrip structure 84, as shown in FIG. 3. A carrier frequency of 449 MHz has been employed in the preferred embodiment of the invention. The microstrip conductors 72 and 74 are supported by a substrate 86 with a metallic ground plate 88 located on a back side of the substrate 86 opposite the conductors 72 and 74. The conductors 72 and 74 are formed of strips of metal, such as copper, and are deposited in accordance with well-known photolithographic techniques upon the substrate 86. The substrate 86 is formed of well-known dielectric, electrically insulating material.

The amplifier element 30 comprises a pair of transistors 90 and 92, constructed as a matched pair, the transistors 90 and 92 having respective base terminals 94 which are connected together and grounded at circuit point 96. The emitter terminals 98 of the transistors 90 and 92 are connected respectively to the conductors 72 and 74. The collector terminals 100 of the transistors 90 and 92 are connected respectively to the conductors 76 and 78. Each of the transistors 90 and 92 is type NPN having bipolar construction. In addition, each of the transistors 90 and 92 is designed to operate in a saturation mode as well as in Class-C mode of operation.

As shown in FIG. 2, the conductor 72 is connected to the center terminal of the coaxial line segment 68 via the balun 70, and the conductor 74 is connected to the outer conductor of the line segment 68 via the balun 70. The coaxial line segment 68 is 4.8 inches long, and has a 50 ohm characteristic impedance in the preferred embodiment of the invention. The output coaxial line segment 80 has the same length and characteristic impedance as the coaxial line segment 68. The outer conductors of the coaxial line segments 68 and 80 are grounded at 56, the ground being a common ground provided by the ground plate 88 of FIG. 3.

In FIG. 2, each of the conductors 72 and 74 operate as a transmission line for conduction of microwave signals to the respective transistors 90 and 92. Tuning capacitors C5, C6, C7, and C8 interconnect the conductors 72 and 74 at specific locations along the conductors 72 and 74 as shown in FIG. 2. It is noted that the signals conducted via the conductors 72 and 74 are 180 degrees out of phase relative to each other. The capacitors C5, C6, C7, and C8 serve to balance the two signal channels represented by the conductors 72 and 74. An analogous form of construction is employed for the output signals of the transistors 90 and 92, at their respective collector terminals 100. The output signals are coupled from the collector terminals 100 by the conductors 76 and 78, these two conductors being interconnected by a set of capacitors C9, C10, C11, and C12. The capacitors C9, C10, C11, and C12 are interconnected between the two conductors 76 and 78 at specific locations as shown in FIG. 2 for balancing the two signal channels. Also, these capacitors provide the function of adjustment of phase to signals propagating along the respective transmission lines in each of the amplifier channels 28 to enable a cophasal summation of the respective channel signals at the power combiner 42. The phase adjust function is shown also in FIG. 1.

The input terminal ends of the conductors 72 and 74 are directly connected (DC) at the balun 70 to the coaxial line segment 68. The output terminal of the conductors 76 and 78 are capacitively coupled, respectively, by capacitors C1 and C2, at the balun 82 to the coaxial line segment 80. DC electric power from the positive terminal of a power supply VCC is conducted via inductors L3 ad L4, respectively, for energization of the transistors 90 and 92. The inductors L3 and L4 connect respectively with the conductors 76 and 78. Further inductors L1 and L2 connect the conductors 72 and 74, respectively, to ground. Current for the transistor 90 flows from the power supply VCC through the inductor L3 to the collector terminal 100, and exits the transistor 90 via the emitter terminal 98 and the inductor L1 to ground for the return path to the power supply VCC. In similar fashion, current from the power supply VCC flows via the inductor L4 to the collector terminal 100 of the transistor 92, and exits the transistor 92 via the emitter terminal 98 to be conducted via the inductor L2 to ground and back to the power supply VCC.

Use of the inductors L1, L2, L3, and L4 serve to isolate the power supply lines from the microwave signals. Each of the respective transmission lines provided by the conductors 72, 74, 76, and 78 have a characteristic impedance of 25 ohms. The capacitors C1 and C2 block the DC current flow from the power supply VCC to the terminals of the coaxial line segment 80. The capacitors C3 and C4 connect respectfully to terminals of the inductors L3 and L4 to divert microwave signals from the power lines of the power supply VCC by providing a return path to ground for any portion of a microwave signal which may have passed, respectfully, through the inductors L3 and L4. The inductances of the inductors L3 and L4 are chosen to resonate with the capacitances of the capacitors C3 and C4, respectively, at the repetition frequency of pulses of the envelope of the pulsed carrier signal.

Figure 4:
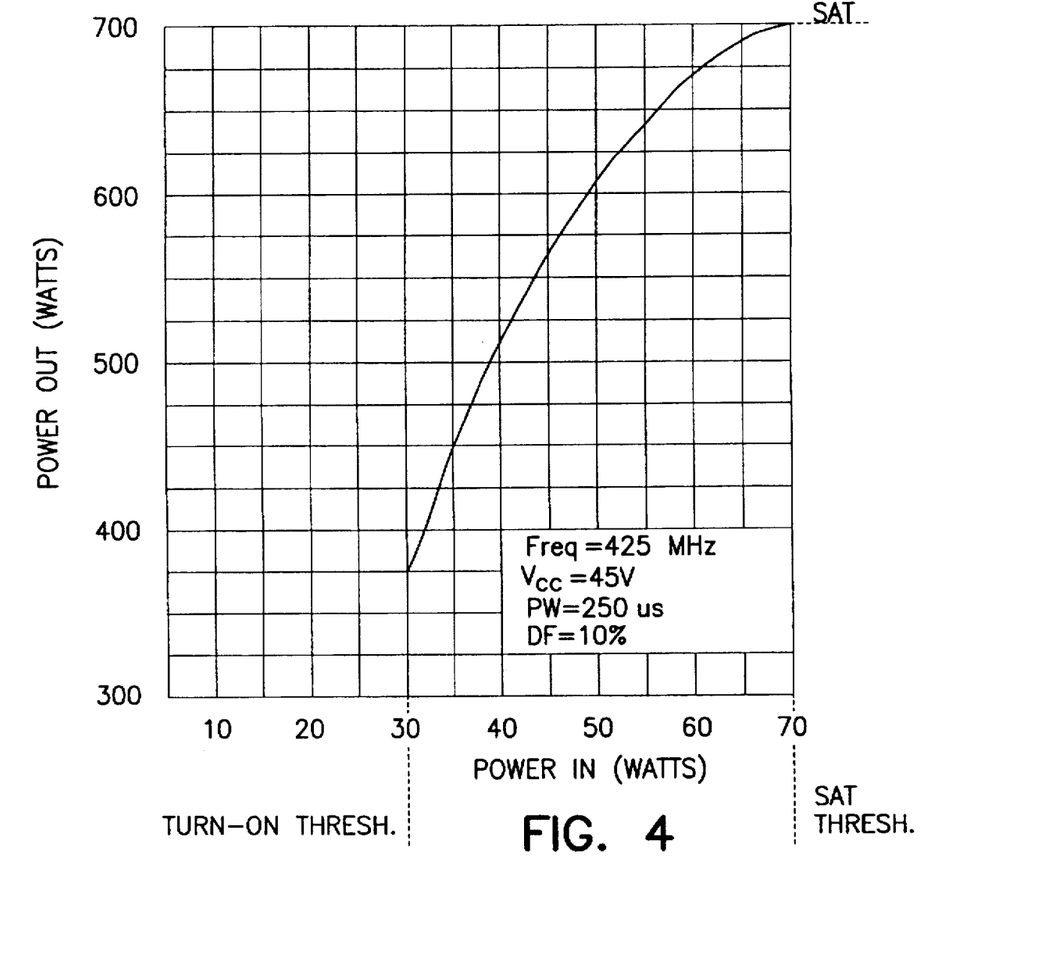
FIG. 4 is a graph showing a relationship of output power to input power of an amplifier element of the amplifier of FIG. 2.

With reference to FIG. 4, the amplifier element 30 (FIG. 2) is operative over an input power range of 30–70 watts, the input power being applied to the two emitter terminals 98. This is shown in the graph of FIG. 4. Below an input power level of 30 watts, the turn-on threshold, there is no significant output power and, accordingly, the graph terminates at that point. Also, beyond an input power of 70 watts, the transistors 90 and 92 enter into their respective saturation regions, and the output power remains at approximately 700 watts. Thus, the input power level of 70 watts may be regarded as the saturation threshold. In terms of input voltage (not shown in FIG. 4) there is a turn-on voltage, at the base emitter junction of each of the transistors 90 and 92, which must be exceeded before there is a flow of current through the base emitter junction. Thus, in the case of low level input sinusoidal signals, wherein each value of the sinusoidal signal is less than the turn-on voltage, no output signal is obtained at the collector terminal 100 of each of the transistors 90 and 92.

Upon an increase of the voltage of the input sinusoidal signal above the turn-on voltage level, that portion of each cycle of the sinusoidal signal which exceeds the turn-on voltage is amplified. Thus, as will be described further with reference to the drawings, particularly FIGS. 6 and 11, there results a clipped sine wave at the output terminal of each of the transistors 90 and 92. Upon a combination of the signals outputted by the transistors 90 and 92 at the balun 82, there appears in the coaxial line segment 80 a modified sinusoidal signal, having excursions in both positive and negative voltage directions, wherein each positive half cycle and each negative half cycle of the waveform has a non-zero value of voltage for only a fraction of each half cycle. For large values of input signal voltage, wherein the peak voltage exceeds the voltage level required for the saturation of each of the transistors 90 and 92, the top portion of each cycle of the resulting quasi-sinusoidal signal is limited in amplification to produce a signal which more closely resembles a square-wave signal. As is well known, such operation of the amplifier 30, wherein the transistors 90 and 92 are either in a state of saturation or in a state of nonconduction for most of each cycle of the input sinusoidal signal, the efficiency of the amplifier element 30 is greatly increased because of reduced power dissipation within the amplifier element 30 itself.

By way of example in the construction of the amplifier element 30, a transistor type SD1565 manufactured by SGS-THOMPSON MICROELECTRONICS has been employed in the construction of a preferred embodiment of the invention, and the data presented in the graph of FIG. 4 is based on the use of such transistor at a pulse repetition frequency of 425 MHz with a power supply voltage of 45 volts, a pulse width of 250 microseconds, and a duty factor of 10%. For purposes of practicing the invention in accordance with a preferred embodiment of the invention, the "saturation threshold" is that level of input signal wherein the incremental power gain of the transistor 90 or 92 has developed a 3 dB from the gain in the linear region of operation.

Figure 5:
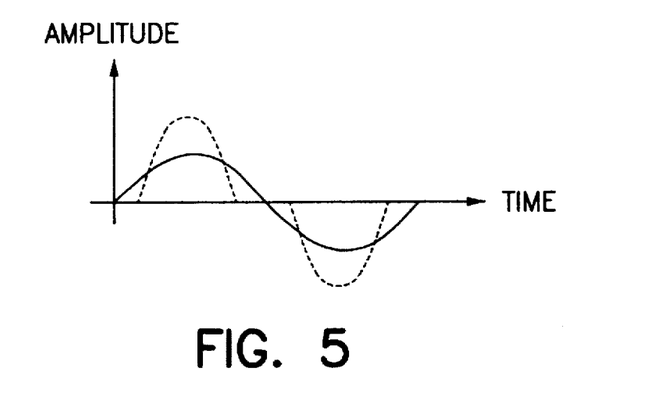
FIG. 5 is a graph showing input and output signals of the amplifier element for signals of moderate amplitude wherein the amplifier element operates in a generally linear mode.

FIG. 5 shows, via a graph, the results of applying a relatively small amplitude signal to the amplifier element 30, the peak value of the small amplitude signal, shown at 102, being located between the turn-on input voltage level and the voltage level of the saturation threshold. The resulting output signal 104 shows a generally sinusoidal waveform, except for a dead-time region 106 in the neighborhood of each of the zero-crossover points of the input signal, wherein the transistors 90 and 92 (FIG. 2) are in states of nonconduction.

Figure 6:
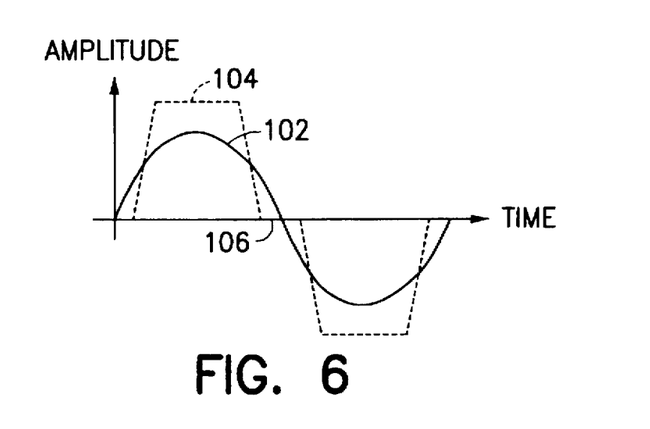
FIG. 6 is a graph showing input and output signals of the amplifier element for the case of relatively large signal amplitudes which induce saturation of the amplifier element.

The graph of FIG. 6 shows the situation wherein the input signal level applied to the amplifier element 30 has peak values which exceed the voltage at the saturation threshold level. The waveform of the resulting output signal has a substantially flat top during the interval of time wherein the transistors 90 and 92 are in their respective states of saturation. The dead-time region in the output waveform of FIG. 6 has a shorter duration than the dead-time region 106 shown in FIG. 5. The waveform of the output signal of the graph of FIG. 6 may be approximated by a square waveform.

It is useful to compare waveforms present in the circuitry of the invention with waveforms appearing in the prior art. Accordingly, in FIG. 7, there is shown a saturating amplifier 108 connected in series with a band-pass filter 110 wherein, in accordance with the arrangement of the prior art, the band-pass filter 110 is connected to an output terminal of the Class-C saturation amplifier 108. The amplifier 108 has an input terminal A, and an output terminal B via which connection is made to the filter 110. Terminal C is the output terminal of the filter 110. The function of the filter 110 is to filter out excessive spectral power outside of the necessary passband of the filter 110. The passband is sufficient for passing modulation of the signal by the amplifier 108, but is less than the overall spectrum of the signal outputted by the saturated waveform of the amplifier 108.

Figure 7:
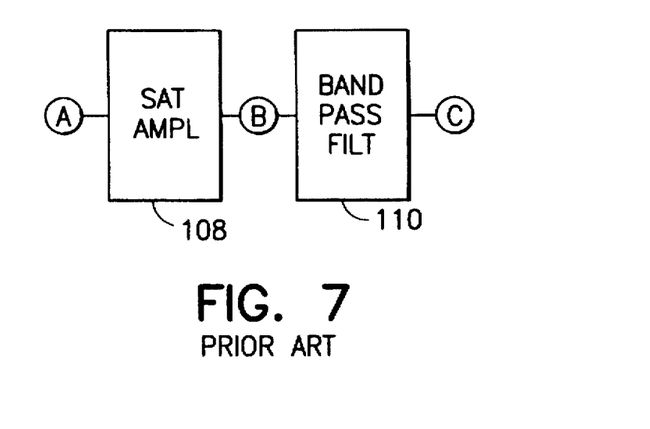
FIG. 7 is a block diagram showing a saturation mode amplifier followed by a band-pass filter in accordance with the prior art.
Figure 8:
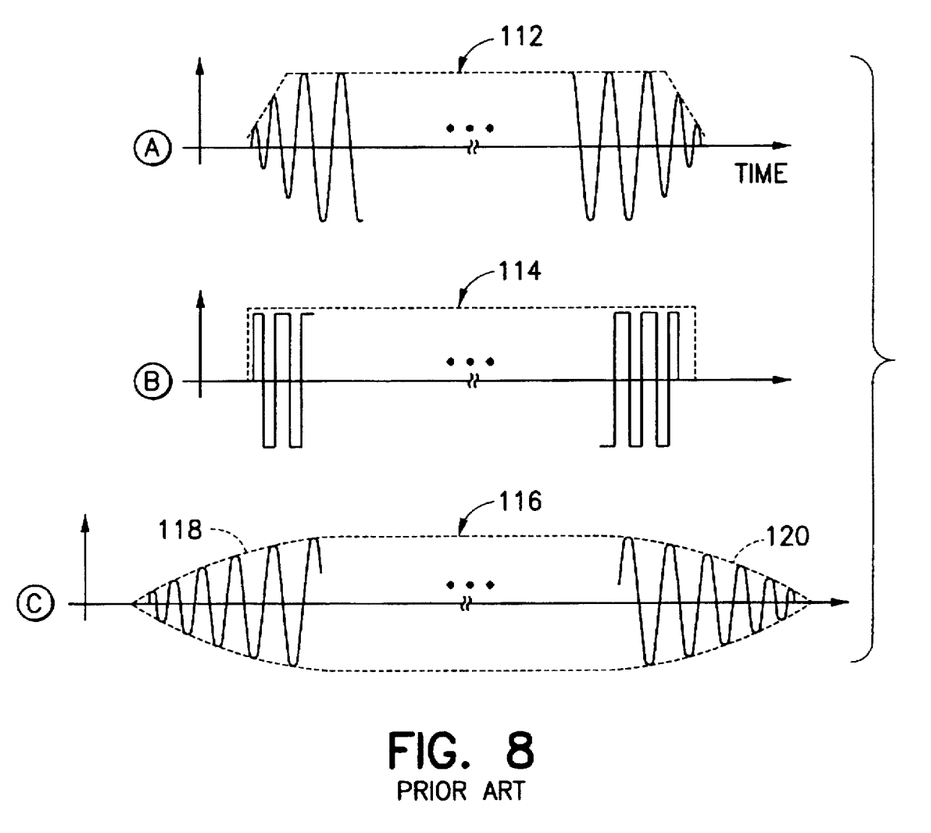
FIG. 8 shows waveforms at terminals A, B, and C of the diagram of FIG. 7, in accordance with the prior art.

In FIG. 8, there are shown stylized waveforms of the signals appearing at terminals A, B, and C of FIG. 7. Signal envelopes 112, 114, and 116 are shown also in FIG. 8, respectively, for the signals at the terminals A, B, and C. At terminal A, there is a pulse of sinusoidal carrier signal. The envelope 112 of the signal at terminal A has a substantially rectangular form. At terminal B, the output signal of the amplifier 108 is represented in simplified form as a square wave for which the envelope 114 has a rectangular envelope. Leading and trailing edges of the envelope 114 are more steep than the corresponding edges of the envelope 112 due to the Class-C saturated mode of operation, and the resulting rapid turn-on and turn-off times of the amplifier 108. The filter 110 alters the signal at terminal B to output, at terminal C, a corresponding signal wherein the envelope 116 may be approximated by a trapezoid.

The leading edge 118 of the signal at terminal C is approximated by a ramp in the envelope 116. The trailing edge 120 of the signal at terminal C is also approximated by a ramp in the envelope 116. The effect of the filter 110 is to delay the propagation of the signal, and to alter the signal such that the cycles of the sinusoid at the leading edge 118 start with relatively small amplitude sinusoids and slowly build to the peak amplitude while, at the trailing edge 120, the amplitudes of the respective cycles of sinusoid slowly decrease in amplitude. It is noted that the true envelope of the amplitude of the cycles of sinusoid in each of the leading and the trailing edges 118 and 120, is a nonlinear smooth function of time. However, to facilitate discussion of the prior art and the invention, it is useful to approximate the leading and trailing edge envelopes by linear ramps.

Figure 9:
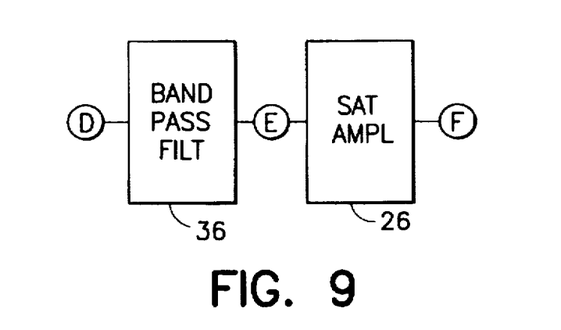
FIG. 9 is a block diagram showing a band-pass filter preceding a Class-C saturated mode amplifier in accordance with the present invention.
Figure 10:
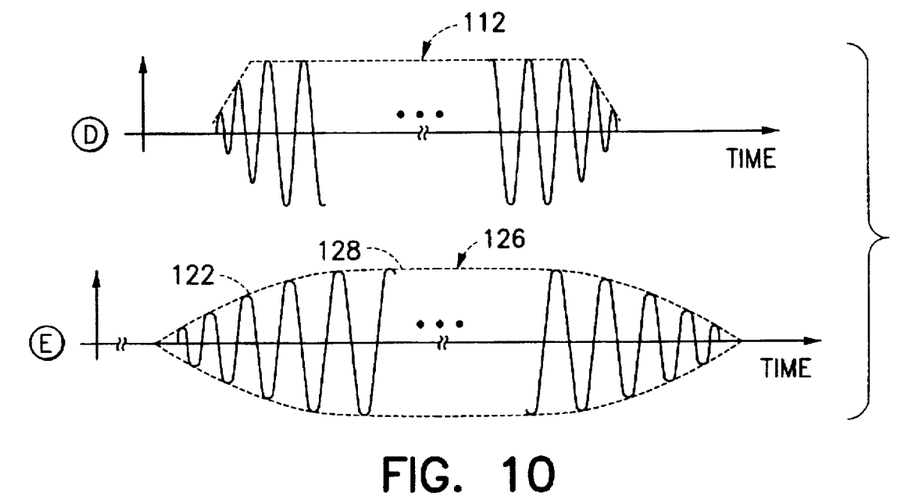
FIG. 10 is a graph showing waveforms at input terminal D of the band-pass filter, and the input terminal E of the Class-C saturated-mode amplifier of FIG. 9.

In a simplified representation of the present invention, as shown in FIG. 9, the band-pass filter 36 is shown preceding the high-power amplifier 26, these elements having been described earlier in FIG. 1. Also shown in FIG. 9 are the terminals D, E, and F previously shown in FIG. 1. FIG. 10 shows the signal waveforms appearing at terminals D and E. The waveform of the signal at terminal D is recognized as being essentially the same as the signal at terminal A of FIG. 8. In FIG. 10, the band-pass filter 36 modifies the signal at terminal D to present, at terminal E, a signal having leading and trailing edges 122 and 124 of a substantially trapezoidal envelope 126 of which a central portion 128 is substantially flat. The cycles of the sinusoidal signal slowly build up in amplitude within the leading edge 122, remain at a substantially constant amplitude in the central portion 128, and gradually decrease in amplitude at the trailing edge 124.

With respect to the signal at terminal E, at the beginning of the leading edge 122, the amplitudes of the first few cycles of the sinusoidal signal are less than the turn-on threshold of the amplifier element 30 (FIG. 2), and in the mid portion of the leading edge 122, the signal cycles have values of amplitudes falling between the turn-on threshold and the saturation threshold of the amplifier element 30. At the central portion 128 of the signal, all of the cycles of the sinusoidal waveforms have amplitudes extending above the saturation threshold. At the trailing edge 124, the amplitudes of individual cycles of the signal at the mid portion of the trailing edge 124 have amplitudes falling between the turn-on threshold and the saturation threshold. At the end of the trailing edge 124, the amplitudes of the individual cycles of the sinusoidal waveform are below the turn-on threshold of the amplifier element 30.

In the pulsed carrier signal employed in the preferred embodiment of the invention, the central portion 128 has approximately 800 cycles of the carrier while each of the leading and the trailing edges 122 and 124 have approximately 50 cycles of the carrier. It is noted that while FIG. 9 demonstrates the invention with respect to the second band-pass filter 36 which precedes the high-power amplifier 26, the same principles of the invention apply also to the operation of the first band-pass filter 34 which precedes the driver amplifier 32, the latter having a Class-C saturating stage 50 as has been described above with reference to FIG. 1. With respect to the signal at terminal E, the power of the signal at the central portion 128 raises the current of the transistor 90 or 92 into the saturation region to the extent that the incremental power gain of the transistor has dropped by a decrement of 3 dB from the value of gain at the linear region of the transistor. This value of the decrement is presented by way of example, and may fall within a range typically of 1–6 dB. The number of cycles of sinusoid within each of the leading and the trailing edges 122 and 124 may be in the range of 10–100 cycles for the case wherein the central portion of the signal has 800 cycles.

Figure 11:
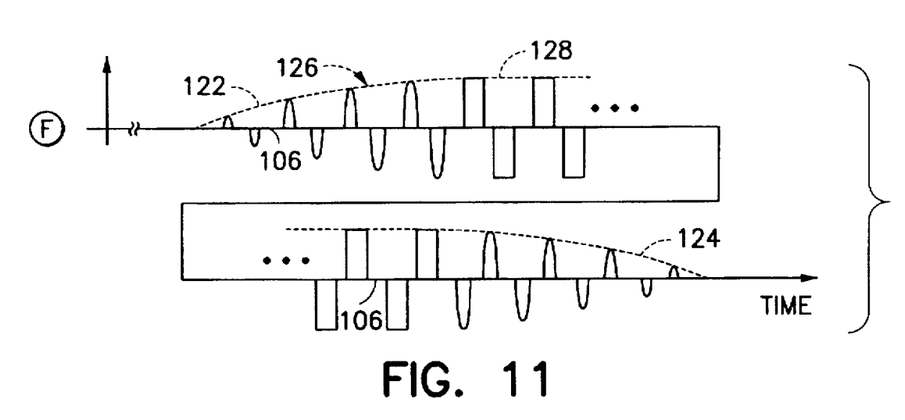
FIG. 11 is a graph showing the output signals of the amplifier of FIG. 9 in the case of the saturation mode of operation.

The graph of FIG. 11 shows the effect of the saturation mode of operation of the high-power amplifier 26. The signal of terminal E is input to the amplifier 26. There results an output signal at terminal F as described in the graph of FIG. 11. The envelope of the waveform of the output signal at terminal F differs in certain respects from the envelope of the input signal at terminal E but, to facilitate comparison, the corresponding portions of the envelope are identified by the same legends employed in describing the waveform of the signal at terminal E.

Thus, in FIG. 11, the envelope 126 has a central portion 128 with a leading edge 122 and a trailing edge 124. At the beginning of the leading edge 122, the signal has a waveform similar to that described in FIG. 5. The signal grows in amplitude until, at the central portion 128, the signal takes the form of the signal shown in FIG. 6. At the trailing edge 124, the signal decreases in amplitude with successive cycles having a lower amplitude, each of the signal cycles having a waveform similar to that disclosed in FIG. 5. It is noted that, immediately preceding the leading edge 122, and immediately following the trailing edge 124, there is a lack of the appearance of the cycles in the output waveform because the corresponding cycles of the input signal have amplitudes lower than the turn-on threshold of the amplifier element 30. The overall configuration of the envelope 126 of the signal at terminal F is generally similar to the overall appearance of the envelope 116 of the signal at terminal C of the prior art. Accordingly, both the signals at terminal C and terminal F would have similar spectra. Thereby, the invention has been able to obtain the desired output spectra without the need of the bulky filter 110 of FIG. 7; the invention employs a much smaller filter 36 which precedes the bank of amplifier channels 28 (FIG. 1).

With respect to FIG. 1, and with respect to a typical signal employed in a preferred embodiment of the invention, the rise time of the signal at terminal G, measured between the 10% and the 90% value of the leading edge is less than 200 nanoseconds. The fall time of the signal at terminal H, as measured between the 90% value and the 10% value, is 600 nanoseconds. The rise time at terminal G is 400 nanoseconds, and the fall time at terminal E is in the range of typically 700 nanoseconds to 1000 nanoseconds. The first bandpass filter 34 is a Gaussian filter having a center frequency in the preferred embodiment of the invention, of 449 MHz with a 3 dB (decibel) bandwidth of 1.0 MHz (maximum) and a 40 dB bandwidth of 5.0 MHz (maximum). The insertion loss is 1.5 dB. With respect to the second band-pass filter 36, the filter is a Chebyshev type filter with a 0.1 dB ripple in the central portion of the filter spectrum. The center frequency is 449 MHz in the preferred embodiment of the invention. The three dB bandwidth is 850 KHz (kilohertz), the 20 dB bandwidth is 1.95 MHz (maximum), the 35 dB bandwidth is 5.5 MHz (maximum), and the 50 dB bandwidth is 20 MHz (maximum). The insertion loss is 1.5 dB (maximum). The central portion 128 of the output signal of terminal F has a duration substantially equal to the predetermined width of the pulse signal outputted by the signal source 22 (FIG. 1) to the first band-pass filter 34. This pulse width is retained in the combined operation of the first band-pass filter 34 and its succeeding driver amplifier 32, as well as in the combined operation of the second band-pass filter 36 and its succeeding high-power amplifier 26.

Typical measured power levels at circuit points in FIG. 1 for a preferred embodiment of the invention are as follows: At terminal H, there is a power level of 10 mw (milliwatts) peak. At terminal D, there is a power level of 650 watts peak. At terminal D, there is a power level of 650 watts peak. At terminal E, there is a power level of 35 watts peak. At the output terminal of the amplifier stage 38, there is a power level of 300 watts peak. At the input terminal of the amplifier channel 28, there is a power level of 70 watts peak. At the output terminal of the amplifier channel 28, there is a power level of 650 watts peak, and over 2 KW (kilowatts) of peak power is present at terminal F for each of the high power amplifiers 26.

Figure 12:
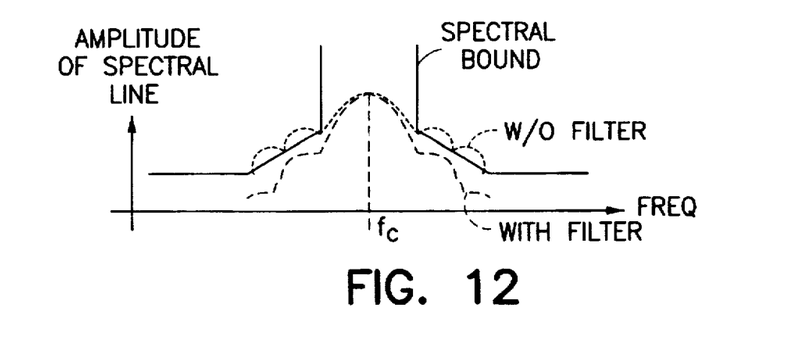
FIG. 12 shows a stylized representation of the spectrum of the signal outputted at terminal F of the saturation amplifier of FIG. 9 for comparison with a spectral bound for prevention of interference with neighboring electronic devices.

FIG. 12 demonstrates control of the output spectrum of the signal at terminal F for meeting spectral requirements such as those imposed upon each electronic device of a group of multiple electronic devices to prevent spectral interference with the operations of the respective devices. An outer bound of the spectrum is indicated by solid lines, the spectrum being centered about the carrier frequency fc. The spectrum itself is indicated in dotted lines. The spectrum of a signal at terminal F which would be produced in the absence of the filter 36 is indicated in dashed lines. It is noted that the dashed lines pass, in part, outside of the bound, while the actual spectrum obtained by use of the filter 36 in front of the amplifier 26 meets the requirements of the bound.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A method of reducing spectral distribution of energy in a pulsed carrier signal amplified by a Class-C saturating amplifier element, the signal having the form of a pulse and comprising a sinusoidal carrier waveform modulated in amplitude with a substantially rectangular envelope of predetermined width and being substantially uniform in peak amplitude, said amplifying element having a substantially linear operating range for input power levels above a turn-on threshold power level and a saturation operating region, the method comprising:

modifying the envelope of the signal pulse to provide a modified envelope having a leading edge ramp of a generally monotonically increasing amplitude, and a trailing edge ramp of a generally monotonically decreasing amplitude, there being a central region having said substantially uniform peak amplitude interposed between said leading edge ramp and said trailing edge ramp;

setting the peak amplitude of the signal pulse to induce a saturated mode of operation in said amplifier element, there being a level of saturation providing a decrement in incremental gain by a predetermined factor; and     applying the pulse signal with the modified envelope to said amplifier element, said amplifier element outputting an output signal comprising a central portion of square-wave carrier waveform of substantially constant amplitude preceded by a leading-edge ramp of sinusoidal carrier waveform and succeeded by a trailing-edge ramp of sinusoidal carrier waveform.

2. A method according to claim 1 wherein the central portion of the output signal has a duration equal to said predetermined width.

3. A method according to claim 1 wherein said incremental gain decrement factor has a value in a range of approximately 1-6 decibels.

4. A method according to claim 1 wherein said incremental gain decrement factor has a value of 3 decibels.

5. A method according to claim 1 wherein each of said leading-edge and said trailing-edge ramps of the modified envelope has a plurality of cycles of sinusoidal waveform.

6. A method according to claim 5 wherein, in said modified envelope, each of said ramps has at least 5 cycles of the sinusoidal waveform.

7. A method according to claim 6 wherein, in said modified envelope, each of said ramps has a range of 10–80 cycles of the sinusoidal waveform.

8. A method according to claim 7 wherein, in said modified envelope, each of said ramps has approximately 50 cycles of sinusoidal waveform.

9. A method according to claim 1 wherein said modifying step is accomplished by use of a band-pass filter having a passband sufficiently wide to pass modulation of the pulse carrier signal but sufficiently narrow to reduce extraneous spectral energy outside of the filter passband.

10. A system having a saturating amplifier element, the system providing for reduction of spectral distribution of energy in a pulsed carrier signal amplified by a Class-C saturating amplifier element, the signal having the form of a pulse and comprising a sinusoidal carrier waveform modulated in amplitude with a substantially rectangular envelope of predetermined width and being substantially uniform in peak amplitude, said amplifying element having a substantially linear operating range for input power levels above a turn-on threshold power level and a saturated operating region, the system further comprising:

means coupled to an input terminal of said amplifier element for modifying the envelope of the signal pulse to provide a modified envelope having a leading edge ramp of a generally monotonically increasing amplitude, and a trailing edge ramp of a generally monotonically decreasing amplitude, there being a central region having said substantially uniform peak amplitude interposed between said leading edge ramp and said trailing edge ramp;

wherein said modifying means outputs the pulsed carrier signal with the peak amplitude sufficiently large to induce a saturated mode of operation in said amplifier element, there being a level of saturation providing a decrement in incremental gain by a predetermined factor; and said amplifier element outputs an output signal comprising a central portion of carrier waveform of substantially constant amplitude preceded by a leading-edge ramp of sinusoidal carrier waveform and succeeded by a trailing-edge ramp of sinusoidal carrier waveform.

11. A system according to claim 10 wherein the central portion of the output signal has a duration equal to said predetermined width.

12. A system according to claim 10 wherein said incremental gain decrement factor has a value in a range of approximately 1–6 decibels.

13. A method according to claim 10 wherein said incremental gain decrement factor has a value of 3 decibels.

14. A system according to claim 10 wherein each of said leading-edge and said trailing-edge ramps of the modified envelope has a plurality of cycles of sinusoidal waveform.

15. A system according to claim 14 wherein, in said modified envelope, each of said ramps has at least 5 cycles of the sinusoidal waveform.

16. A method according to claim 15 wherein, in said modified envelope, each of said ramps has a range of 10–80 cycles of the sinusoidal waveform.

17. A system according to claim 16 wherein, in said modified envelope, each of said ramps has approximately 50 cycles of sinusoidal waveform.

18. A system according to claim 10 wherein said modifying means comprises a band-pass filter having a passband sufficiently wide to pass modulation of the pulse carrier signal but sufficiently narrow to reduce extraneous spectral energy outside of the filter passband.

19. A system according to claim 18 further comprising a Class-C saturating driver amplifier coupled to and preceding said modifying means, and a driver band-pass filter coupled to and preceding said driver amplifier, wherein said driver band-pass filter is operative to induce a generally trapezoidal form of envelope appearing in an output signal of the driver amplifier, thereby maintaining a generally trapezoidal signal envelope within said system from a point prior to said driver band-pass filter to an output terminal of said amplifier element.

20. A system according to claim 19 further comprising a signal source providing a pulse modulated carrier signal to said driver band-pass filter, and an antenna assembly coupled to an output terminal of said saturating amplifying element for emitting radiation constrained to a spectral band of reduced amplitude of spectral components associated with rapid cut-off time of said Class-C saturating amplifier element, said cut-off time being substantially smaller than a cycle of the sinusoidal carrier waveform.

21. A system according to claim 19 wherein said Class-C saturating amplifier element is constructed as a push-pull matched transistor pair with grounded base circuit, and a pair of microstrip transmission lines coupling a signal from said modifying means to respective input terminals of said matched transistor pair.

22. A system according to claim 21 wherein said system serves as a radar transmitter, and said transistor pair and said microstrip transmission lines constitute a part of a first amplifier channel, there being a plurality of said amplifier channels including said first amplifier channel, and wherein said system further comprises a power divider interconnecting said amplifier channels to said modifying means, and a power combiner interconnecting output terminals of said amplifier channels to a common output terminal of said power combiner.

23. A system according to claim 22 further comprising a signal source providing a pulse modulated carrier signal to said driver band-pass filter, and an antenna assembly coupled to said output terminal of said power combiner for emitting radiation constrained to a spectral band of reduced amplitude of spectral components associated with rapid cut-off time of said Class-C saturating amplifier element, said cut-off time being substantially smaller than a cycle of the sinusoidal carrier waveform.

* * * * *